United States Patent [19]
Wong

[11] Patent Number: 6,160,739
[45] Date of Patent: Dec. 12, 2000

[54] NON-VOLATILE MEMORIES WITH IMPROVED ENDURANCE AND EXTENDED LIFETIME

[75] Inventor: Sau C. Wong, Hillsborough, Calif.

[73] Assignee: SanDisk Corporation, Sunnyvale, Calif.

[21] Appl. No.: 09/293,133

[22] Filed: Apr. 16, 1999

[51] Int. Cl.$^7$ ..................................................... G11C 16/04
[52] U.S. Cl. ................ 365/185.29; 365/185.33
[58] Field of Search .................. 365/185.29, 185.33, 365/185.27, 185.18

[56] References Cited

U.S. PATENT DOCUMENTS

| | | | |
|---|---|---|---|
| 5,047,981 | 9/1991 | Gill et al. | 365/185.18 |
| 5,341,342 | 8/1994 | Brahmbhatt | 365/185.3 |
| 5,777,923 | 7/1998 | Lee et al. | 365/185.11 |

FOREIGN PATENT DOCUMENTS 226054A  7/1994  Taiwan.

WO9749086  12/1997  WIPO.

*Primary Examiner*—Vu A. Le
*Attorney, Agent, or Firm*—Majestic, Parsons, Siebert & Hsue

[57] ABSTRACT

Non-volatile memory cells in a sector of a memory array are selectively erased only when it is determined that the selected memory cells require erasing. A memory cell is selectively erased by applying two non-zero erase voltages to the cell, where the combination of the two erase voltages generates an electric field sufficient to induce Fowler-Nordheim tunneling and erase the cell. Memory cells not selected for erasing, either in the same sector or other sectors, have only one or none of the two erase voltages applied, which is insufficient to erase the unselected memory cells is a result, endurance of the non-volatile memory cells is improved because the memory cells are not subjected to repeated unnecessary erasing and programming operations.

10 Claims, 4 Drawing Sheets

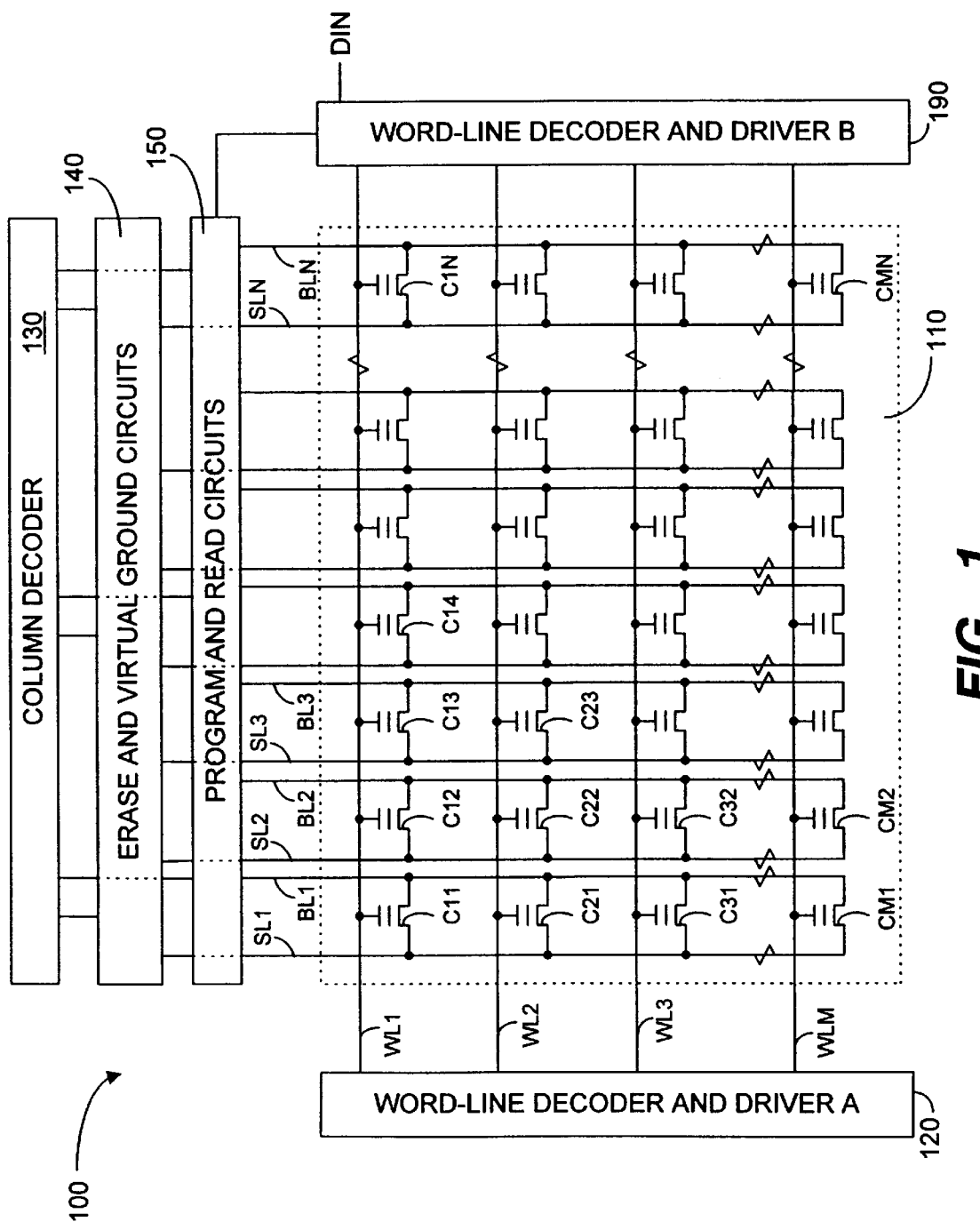
FIG._1

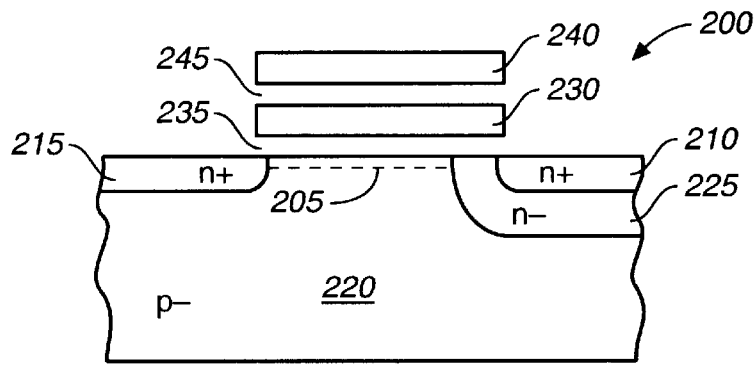
FIG._2
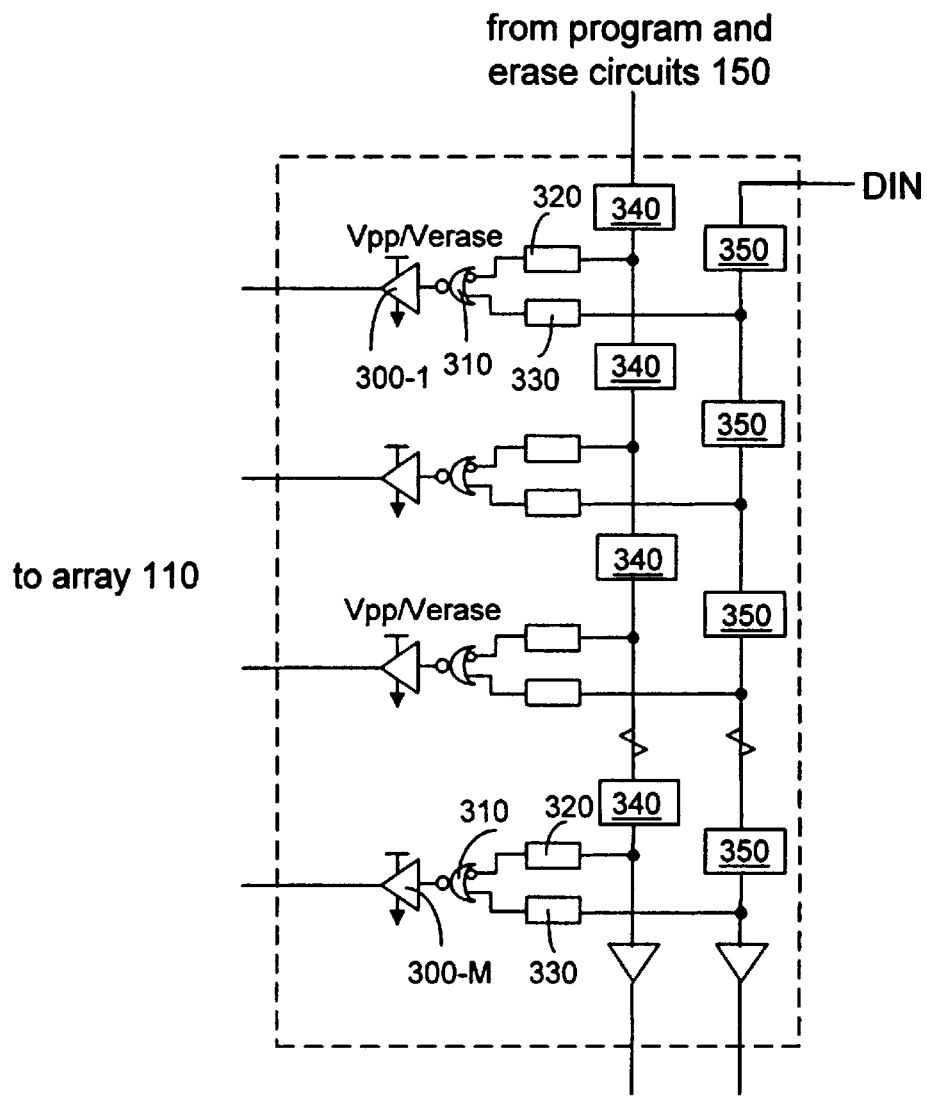
FIG._3

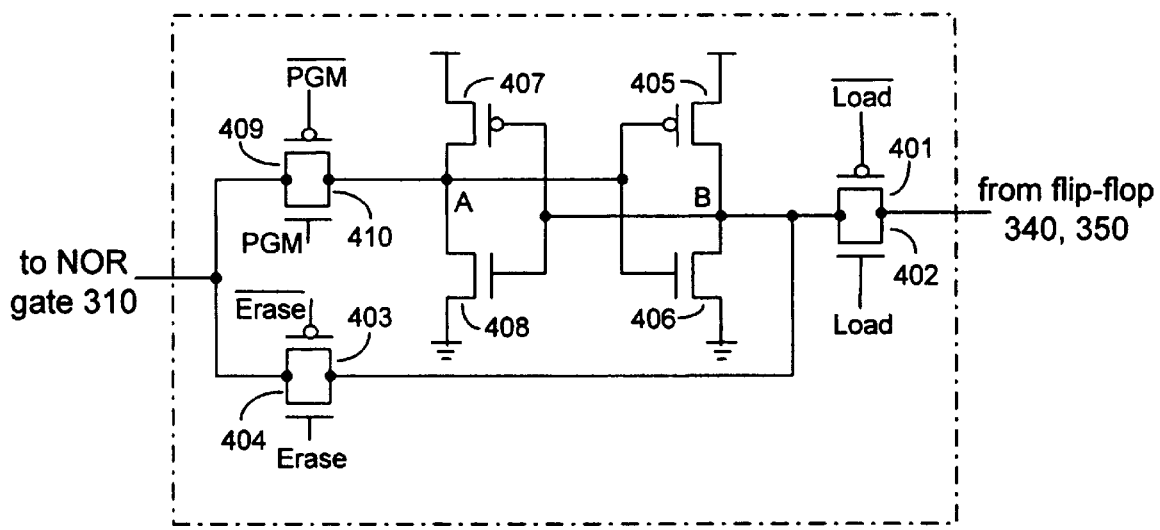
FIG._4
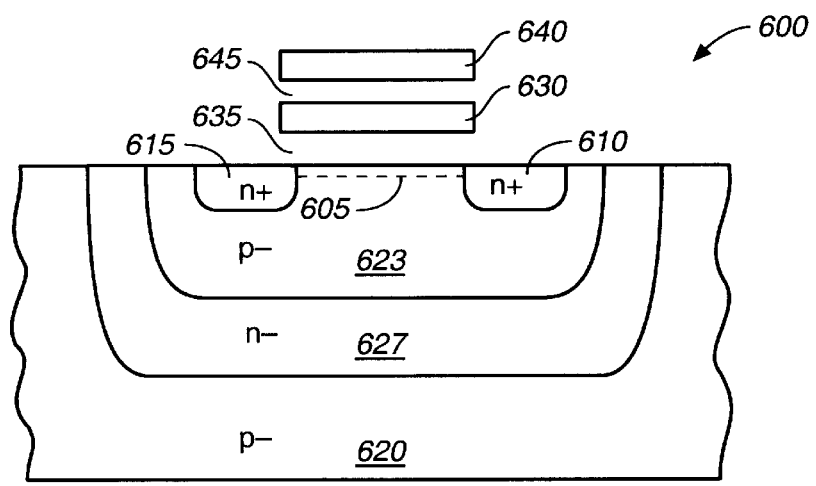
FIG._6

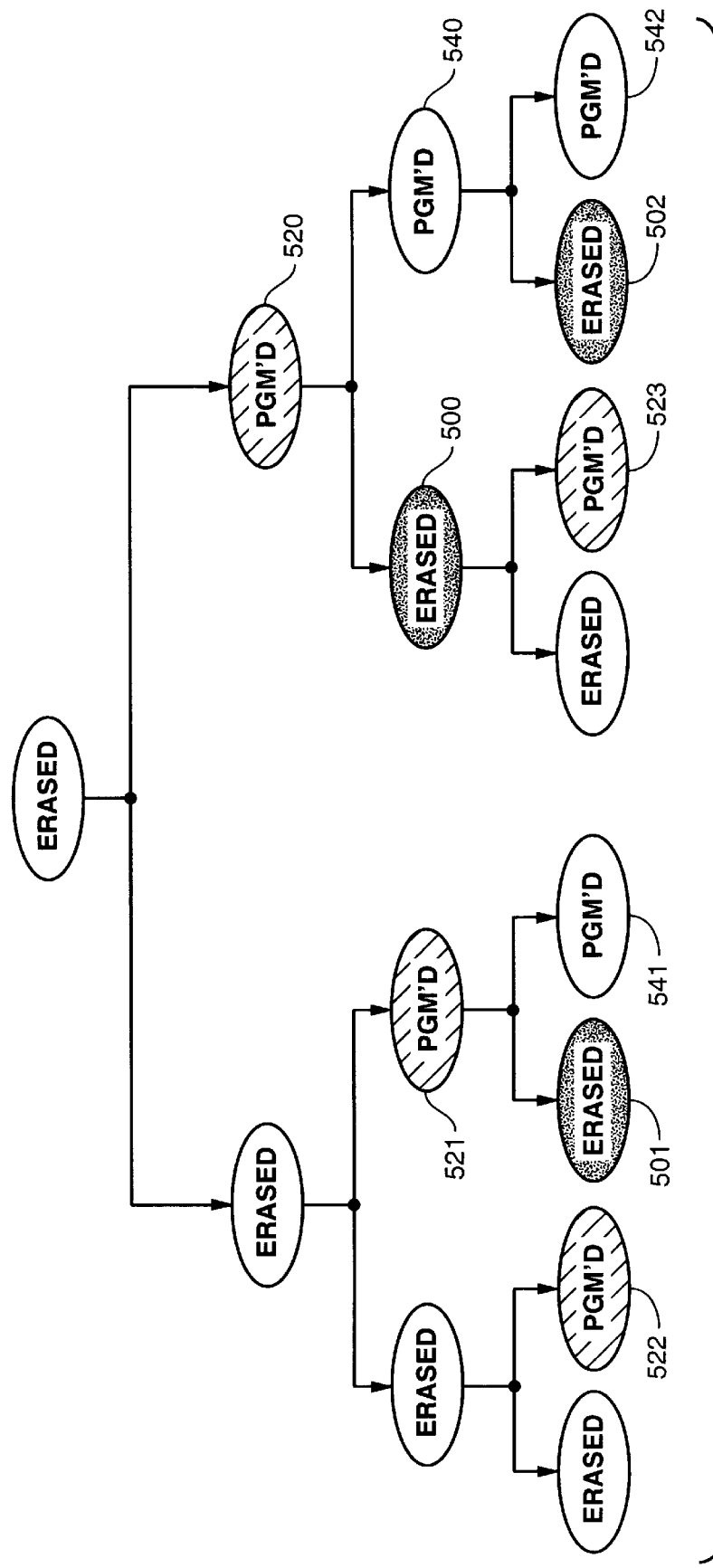
FIG._5

NON-VOLATILE MEMORIES WITH IMPROVED ENDURANCE AND EXTENDED LIFETIME

BACKGROUND

1. Field of the Invention

This invention relates to non-volatile semiconductor memories, and in particular, to improving the endurance of such memories.

2. Description of Related Art

Non-volatile semiconductor memories such as EPROMs, EEPROMs, and Flash memories are well known. In such memories, a threshold voltage Vt of a memory cell indicates a data value stored in the memory cell. When writing (programming) to a selected memory cell in a conventional non-volatile memory array, programming voltages are applied via a word-line (WL) connected to a control gate of the selected cell, via a bit-line (BL) connected to a drain of the selected cell, and a via source-line (SL) coupled to a source of the selected cell. The combination of programming voltages changes the threshold voltage of the selected cell, typically by causing Fowler-Nordheim (F-N) tunneling or channel hot electron (CHE) injection which charges (or discharges) a floating gate in the selected memory cell.

For example, to induce CHE injection in a selected memory cell containing a typical N-channel floating gate transistor, a high voltage Vpp (e.g., approximately 9 to 12 volts or higher) is applied as the control gate voltage Vg to the WL containing the selected cell, a high voltage (e.g., approximately 4.5 to 5.5 volts or higher) is applied as the drain voltage Vd to the BL containing the selected cell, and a low voltage (e.g., near 0 volt) is applied as the source voltage Vs to the SLs. Hot electrons are injected into the floating gate to increase the threshold level with respect to the control gate, thereby programming the selected cell. By adjusting the programming voltage Vpp and/or duration of the pulse, the selected cell can be programmed to a desired threshold voltage Vt.

Memory cells in conventional Flash memory arrays are typically simultaneously erased, by sectors, blocks, or full-chip, so that all of the cells in the array connected to a common source line are simultaneously erased. Memory cells are erased by discharging the floating gate, which is typically accomplished through Fowler-Nordheim tunneling by creating a large positive voltage difference from the source to the gate of the floating gate transistor, while floating the drain. Suitable voltages, which are well known, are applied to the WLs, BLs, and SLs of the array to supply voltages to the control gate, drain, and source, respectively, of memory cells in the array. These voltages cause electrons to tunnel from the floating gate to the source via Fowler-Nordheim tunneling, thereby returning the cell to an erased state.

However, erase characteristics of non-volatile memory cells are typically somewhat random and difficult to control. The key controllable parameters include tunnel oxide thickness and uniformity of the memory cell, erase voltage, erase time, and the number of cells in a sector which are erased together. In Flash memory arrays, cells connected to a common source line are erased for the same amount of time. Ideally, each cell in the array requires the same amount of time to erase, i.e., to remove electrons from the floating gate and achieve the same lower selected erased threshold voltage. However, practically, individual memory cells have slightly different characteristics, which require slightly different erase conditions to achieve the same erased threshold voltage Vte. Thus, even with existing erase and Vt monitor algorithms, some faster cells (referred to herein as fast-erase cells) may potentially become over-erased, thereby generating excessive positive charge on the floating gate and lowering the erased threshold voltage of the memory cell. In some situations of over-erasing, the erased threshold voltage becomes negative. This can be problematic in numerous ways, including during a read or verify operation.

For a read or verify operation on a selected memory cell, typically 0 volt or ground is applied as the control gate voltage Vg to unselected WLs, i.e., WLs that do not contain the selected cell.

Simultaneously, a fixed read voltage (for conventional memories) or a ramped or stepped read voltage (for analog or multi-bit-per-cell memories) is applied as the control gate voltage Vg to the selected WL for a read operation. For a verify operation, a verify voltage between the two possible threshold voltages representing a "1" and "0" (for conventional memories) or a verify voltage proportional to the desired programmed threshold voltage (for analog or multi-bit-per-cell memories) is applied as the control gate voltage Vg to the selected WL. Some verify operations are described in commonly-owned U.S. Pat. No. 5,687,115, entitled "Write Circuits For Analog Memory" to Wong et al. and U.S. Pat. No. 5,818,757, entitled "Analog and Multi-Level Memory With Reduced Program Disturb" to So et al., and in commonly-owned U.S. patent application Ser. No. 09/128,225, entitled "High Data Rate Write Processes for Non-Volatile Flash Memories, filed Aug. 3, 1998 and Ser. No. 09/224,656, entitled "Dynamic Write Process for High Bandwidth Multiple-Bit-Per-Cell and Analog Non-Volatile Memories, filed Dec. 31, 1998, all of which are incorporated by reference in their entirety.

During a read operation, for conventional memories, a fixed voltage (e.g., approximately supply voltage Vcc) is applied to the control gate of the selected cell, and for analog or multi-bit-per-cell memories, the voltage applied to the control gate of the selected cell is ramped or stepped until the selected memory cell conducts, i.e., when the voltage at the control gate is at or exceeds the threshold voltage of the cell. For an analog/multi-level memory, the voltage is slowly ramped from low to high or high to low voltages, such as described in commonly-owned U.S. Pat. No. 5,687,115, entitled "Write Circuits For Analog Memory", which is incorporated above and U.S. Pat. No. 5,751,635, entitled "Read Circuits For Analog Memory Cells" to Wong et al., which is incorporated by reference in its entirety. For a multi-bit-per-cell memory, the read voltage is increased or decreased in stepped increments using a counter scheme, such as described in commonly-owned U.S. patent application Ser. No. 09/053,716, entitled "High Resolution Multi-Bit-Per-Cell Memory", which is incorporated by reference in its entirety. For a ramped or stepped voltage, the voltage at which the cell conducts represents the analog value stored in the cell. However, erased cells in the same column as the selected cell may contribute sufficient leakage current to the bit-line of the selected cell and cause errors during read or verify operations. As a result, even when 0 volt is applied to the control gates during reading or verify, over-erased cells will conduct slightly, thereby potentially giving an erroneous reading.

The leakage current caused by over-erased cells in a column during a read or verify operation can degrade the performance and reliability of the memory. Ideally, the only cell in the column biased for possible conduction is the cell in the selected word line WL. However, if any of the cells in the selected bit-line or column are over-erased and conduct significant current (i.e., in the sub-threshold conduction region), the combined current flow in the bit-line may exceed the threshold for reading or verify, thereby yielding erroneous results. Leakage current due to over-erased memory cells can also adversely affect the programming of other cells on the same bit-line by reducing the voltage on the bit-line. In some severe situations, a single over-erased cell can disable the entire column. In other cases, many of the cells may be slightly over-erased which provides a cumulative leakage current exceeding the desired threshold.

There are various techniques which can tighten the erased Vt distribution and thus help avoid the "over-erasure" problem. One technique applies iterative erase and verify operations to ensure that the erased threshold voltages of fast-erase cells within the same sector do not become negative. Another technique (referred to herein as a touch-up programming scheme) applies a small amount of programming to all the memory cells after erasure in order to increase the threshold voltages of the fast-erase cells from a slightly negative value to a slightly positive value. A third method programs all the memory cells (the virgin cells) in the sector(s) to a "1" state prior to an erase operation. As a result, the initial threshold voltages of all the memory cells correspond to a "1" state prior to erase. This method can be used in conjunction with the touch-up programming scheme to further reduce the adverse effects of over-erase.

Even with situations where the leakage current is negligible, by using some kind of touch-up programming scheme, the memory cell's characteristics or performance can degrade over time, greatly reducing the reliability and endurance of the device, i.e., the number of cycles that the memory array can be successfully programmed and erased. Repeated erasing and programming of memory cells will cause excessive charge to be trapped in the gate oxide, thereby reducing the performance and endurance of these cells. The endurance of typical Flash memories is over 100,000 program/erase cycles, with some memories capable of 1,000,000 program/erase cycles or more. The increased charge trapped in the gate oxide requires higher programming voltages Vpp and/or longer programming times or pulse duration in order to program a memory cell to the same desired threshold voltage. Similarly, to achieve a desired erased threshold voltage, erase voltages and/or times likewise need to be increased. If program and erase conditions are not properly compensated, continual erasing will cause the margin between a programmed threshold voltage and an erased threshold voltage (or Vt window) to decrease for the affected memory cell. As a result, the sensing margin for read and verify operations decreases. For conventional memories, this will cause access time push-outs, and in analog or multi-bit-per-cell memories, it will lead to decreased dynamic range, poor signal-to-noise ratios, and increased read-out errors. Furthermore, with memory cells that have been subjected to high numbers of erase operations, data can be written to virgin locations within the memory array, which could require a complicated process of tracking virtual and physical addresses.

Thus, it is desirable to reduce the frequency of erase operations and to increase the endurance of non-volatile memories in order to prevent performance degradation and extend the usable lifetime of the memory. As a result, the memory may be used in a much wider range of applications which were previously not practical due to endurance limitations.

SUMMARY

In accordance with an aspect of the invention, during an erase operation of non-volatile memory cells in a selected sector of a memory array, only those memory cells requiring erasing are erased. Selective erasing of memory cells in a sector can be accomplished by applying two non-zero erase voltages to the selected memory cell, where the combination of the two voltages is sufficient to erase the cell. In addition, the memory cells in the sector and array are configured such that application of the two non-zero erase voltages selects a single memory cell for erasing, e.g., memory cells are configured in an x-y array with one voltage applied to a line connecting cells in the x-direction and a second voltage applied to a line connecting cells in the y-direction. By only erasing those memory cells requiring erasing, which also reduces the amount of programming operations, memory cell endurance is improved and useful lifetime is extended since cells are not subjected to repeated unnecessary erase and program (or write) operations.

Suitable erase methods apply non-zero voltages to two terminals of the memory cell. For example, a negative-gate erase scheme applies a negative voltage (e.g., −8 to −10 volts) to the control gate and an intermediate positive voltage (e.g., 5 to 7 volts) to the source of the memory cell selected for erasing. The memory cells can then be arranged with word-lines coupled to control gates and intersecting source-lines coupled to sources of the cells. Another suitable erase method is a channel-erase scheme, in which a negative voltage (e.g., −8 to −10 volts) is applied to the control gate and an intermediate positive voltage (e.g., 5 to 7 volts) is applied to the shallow p-well of the selected memory cell. The structure of these memory cells also includes a deep n-well, in which the shallow p-well is formed. Memory cells in a memory array where erasing is achieved through a channel-erase scheme can be arranged with word-lines coupled to control gates and intersecting lines coupled to shallow p-wells of the cells. While the combination of erase voltages is sufficient to erase the selected cell, the other combinations voltages applied to unselected cells in the same sector or other sectors do not create an electric field large enough for significant Fowler-Nordheim (F-N) tunneling, thereby minimizing erase disturb to unselected adjacent memory cells.

According to one aspect of the invention, for binary data programming and erasing, only those non-volatile memory cells that are stored with a "1" and are to be stored with a "0" are erased, i.e., cells requiring erasing are only those transitioning from a stored "1" state to a stored "0" state, where a "1" represents a high threshold voltage for the cell and a "0" represents a low threshold voltage for the cell. With four possible transitions ("0" to "0", "0" to "1", "1" to "0", and "1" to "1"), the endurance of memory cells in such an array can be improved by a factor of four, assuming equal probability for each transition. In addition, because only those memory cells transitioning from a "1" to a "0" are erased, memory cells transitioning from a "1" to a "1" remain stored with a "1". Consequently, only those memory cells transitioning from a stored "0" to a stored "1" are subject to a programming operation, thereby further improving the endurance and extending the useful lifetime of the memory cells.

In one embodiment, a NOR gate, with one input complemented, compares the value of the data stored in a selected memory cell with the value of the data to be stored. Only when the stored data is a "1" and the data to be stored is a "0" does the NOR gate output a high signal, indicating that the selected cell is to be erased. The output of the NOR gate is coupled to the input of a driver that applies one of the desired erase voltages to the word-line containing the selected memory cell when the driver is activated, i.e., when a high signal is applied to input of the driver. However, when a low signal is applied to the input of the driver, the driver is off and the attached word-line is grounded, thereby preventing the selected memory cell from being erased. When a programming operation is desired, both the complemented and uncomplemented inputs to the NOR.gate are first complemented so that the driver is activated only when the currently stored data is a "0" and the data to be stored or written is a "1". In this case, the driver applies a desired programming voltage to the word-line containing the selected memory cell for programming.

The present invention will be more fully understood upon consideration of the detailed description below, taken together with the accompanying drawings.

BRIEF DESCRIPTION OF THE DRAWINGS

FIG. 1 is a diagram of a non-volatile memory in accordance with one aspect of the present invention;

FIG. 2 is a diagram of a memory cell for use in the memory of FIG. 1;

FIG. 3 is a diagram of a word-line decoder and driver circuit for use in the memory of FIG. 1 according to one embodiment of the present invention;

FIG. 4 is a circuit diagram of according to one embodiment of the latches of the word-line decoder and driver circuit in FIG. 3;

FIG. 5 is a diagram of possible states of a memory cell of FIG. 1 according to one embodiment; and FIG. 6 is a diagram of a memory cell for use in another embodiment of the present invention.

Use of the same reference symbols in different figures indicates similar or identical items.

DETAILED DESCRIPTION OF THE PREFERRED EMBODIMENTS

In accordance with an aspect of the present invention, only memory cells in a non-volatile memory array that require erasing (i.e., a change from a programmed state to an erased state) are erased, which prevents unnecessary erasing and programming of memory cells, thereby improving the endurance and extending the useful life of the memory cells. A combination of two non-zero voltages is applied to these selected memory cells to cause these memory cells to be erased without erasing other memory cells in the same sector. By only erasing memory cells requiring erasing, programming operations can also be reduced since memory cells in a programmed state that are to remain in a programmed state are not erased. As a result, only those memory cells in an erased state that are to be programmed are actually subjected to a programming operation. This further improves the endurance and extends the useful life of the memory cells in the array.

FIG. 1 is a diagram of a Flash memory 100 according to one embodiment of the present invention. Memory 100 contains an array 110 of non-volatile memory cells C11 to CMN. In FIG. 1, each memory cell C11 to CMN is a floating gate transistor, but alternative memory cell architectures include memory cells containing split gate transistors or a combination of memory transistors and select transistors. Array 110 has M rows or word-lines and N columns or bit-lines. Each row of memory cells C11–C1N, C21–C2N, . . . CM1–CMN is associated with the one of word-lines WL1 to WLN that couples to the control gates of the memory cells in the row. Each column of memory cells C11–CM1, C12–CM2, . . . C1N–CMN is associated with the one of bit-lines BL1 to BLN that couples to the drains of the memory cells in the column and the one of N source-lines SL1 to SLN that couples to the sources of the memory cells in the column. Memory 100 is a flash memory such as a Flash EPROM or Flash EEPROM. Accordingly, memory array 110 is further organized into N independently erasable sectors, with each sector containing a single row of memory cells and is associated with the one of source-lines SL1 to SLN and the one of bit-lines BL1 to BLN that is connected to the sources and drains, respectively, of memory cells in the column. For example, memory cells C11 to CM1 comprise one erasable sector.

Connected to array 110 are a word-line decoder and driver A 120, a column decoder 130, erase and virtual ground circuits 140, program and read circuits 150, and word-line decoder and driver B 190. Word-line decoder and driver A 120 couples to word-lines WL1 to WLM and biases word-lines WL1 to WLM as required for program, read, and verify operations, according to one embodiment. As such, word-line decoder and driver A 120 is able to supply negative, positive, ramped or stepped voltages for the various operations and applications, such as disclosed in the above-referenced commonly-owned patents and applications. In the exemplary embodiment, word-line decoder and driver A 120 includes a transistor tree and word-line drivers. The transistor tree decodes a word-line address signal to identify a selected word-line. The word-line drivers control the voltages on the selected word-line and on unselected word-lines. Word-line decoder and driver A 120 selects a word-line voltage according to the desired operation on the selected memory cell. Column decoder 130 couples to bit-lines BL1 to BLN and source-lines SL1 to SLN and applies bias voltages via erase and virtual ground circuits 140 and program and read circuits 150 to bit-lines BL1 to BLN and source-lines SL1 to SLN as required by the desired operation or application.

During a programming operation to a desired memory cell in array 110, in response to an address signal identifying the desired memory cell, word-line decoder and driver A 120 applies a programming voltage Vpp (e.g., 8 to 10 volts) to the word-line containing the selected memory cell. In conjunction with the word-line voltages, column decoder 130 applies an intermediate voltage (e.g., 5 to 6 volts or higher) and applies a low voltage (e.g., approximately ground) to the bit-line and source-line, respectively, containing the selected memory cell. The combination of applied voltages causes channel hot electron (CHE) injection which charges a floating gate in the selected memory cell and changes the threshold voltage to a high state. For example, for conventional memory applications with binary programming, the threshold voltage Vt is typically raised to a voltage higher than the supply voltage Vcc. In this state, the memory cell is "programmed."

During a read operation, word-line decoder and driver A 120 applies a read voltage (e.g., Vcc) to the word-line containing the selected memory cell and applies a low voltage (e.g., ground) to the remaining unselected word-lines, where the unselected word-lines are the ones that do not contain the memory cell selected for the read operation. Also during a read operation, column decoder 130 applies a low voltage (e.g., 1.5 volts to 2 volts) to the bit-line containing the selected memory cell and applies approximately 0 volt to the source-line containing the selected cell. Program and read circuits 150 contain sensing circuits (not shown) that detect current in the corresponding bit-lines for reading the selected memory cell.

During an erase operation, instead of erasing all the memory cells in a sector during an erase operation, only the memory cells in a sector that are required to be erased are erased. This prevents unnecessary repeated erasing of memory cells, which improves the endurance and extends the lifetime of the memory cells. In addition to reducing over-erasing, selective erasing also avoids the need to program all the cells to a programmed state prior to an erase operation (as described above). Selective erasing can be accomplished by applying two non-zero erase voltages to the selected memory cell, which erases the selected memory cell, without erasing other cells coupled to the same sector as the selected memory cell.

In order to selectively erase memory cells within a sector, an erase scheme is employed that applies two non-zero voltages in combination to erase the memory cell. This is analogous to programming schemes that typically require two non-zero voltages in combination to program a selected memory cell. For example, with a two-dimensional array of memory cells, as in array 110, a first non-zero voltage applied to a selected word-line and a second non-zero voltage applied to a selected bit-line or source-line will subject the one selected memory cell to this combination of voltages, which erases the cell. One type of suitable erase scheme (referred to herein as a negative-gate erase scheme) applies a negative voltage (e.g., approximately −8 to −10 volts) to the control gate (or word-line), an intermediate positive voltage (e.g., approximately 5 to 7 volts) to the source (or source-line), and a floating potential or ground to the drain (or bit-line) of the memory cell to be erased.

The combination of voltages produces an electric field between the floating gate and source sufficient to discharge the floating gate, which is typically accomplished through Fowler-Nordheim tunneling. As a result, Fowler-Nordheim tunneling current flows through the thin tunnel oxide film from the floating gate to the source region, and electrons are removed from the floating gate to complete the erase operation and lower the threshold voltage to a desired erase threshold voltage. For example, with binary data being written and erased, the erase threshold voltage is typically less than the supply voltage Vcc. Thus, by applying a negative voltage to the word-line containing the selected memory cell and a positive voltage to source-line containing the selected memory cell, a single selected memory cell associated with the sector can be erased.

For example, in FIG. 1, if it is desired to erase memory cells C12 and C32 in the second sector, 5 to 7 volts is applied to source-line SL2, while a floating potential or ground is applied to the remaining source-lines. A negative erase voltage (e.g., −8 to −10 volts) is applied to word-lines WL1 and WL3, while a ground potential is applied to the remaining word-lines. The bit-lines are at a floating potential or ground. Thus, only memory cells C12 and C32 receive the negative erase voltage at the control gate along with the positive voltage (5 to 7 volts) at the source. As discussed above, this combination generates an electric field sufficient to cause Fowler-Nordheim tunneling current to erase memory cells C12 and C32. However, memory cells on the same word-line or source-line are not erased because of an insufficient electric field between the floating gate and the source. For example, while the same negative erase voltage (−8 to −10 volts) is applied to the control gates of memory cells on the selected word-line(s), e.g., memory cell C13 or C31, the sources of these cells are floating or at ground instead of at a positive voltage (e.g., 5 to 7 volts). Similarly, while the same positive voltage is applied to the sources of memory cells on the selected source-line, e.g., memory cell C12, the control gates of these cells are at ground instead of the negative erase voltage. These combinations of voltages do not create an electric field large enough to generate sufficient Fowler-Nordheim tunneling current to erase the cells or cause significant erase disturb.

In contrast to negative-gate erase, another conventional erase scheme (referred to herein as a grounded-gated erase scheme) only applies one non-zero voltage and cannot selectively erase a memory cell in a sector. A high positive voltage (e.g., approximately 10 to 12 volts) is applied to the source, a low voltage (e.g., approximately 0 volt) is applied to the control gate, and the drain is left floating to generate the electric field for Fowler-Nordheim tunneling. As seen from FIG. 1, the grounded-gated erase scheme is not suitable for selectively erasing a memory cell in a given sector. Application of 0 volt to the unselected word-lines in the same sector as the selected memory cell, in conjunction with the high source-line voltage, causes other memory cells in the sector to be erased. In addition, the high voltage applied to the source during erasing requires a gate-modulated junction breakdown voltage at the side of the source region overlapped by the floating gate to be increased, which can make it necessary to make the source region deeper than the drain region. A deeper source junction requires a longer channel length and limits the ability for device scaling.

Negative-gate erase schemes, on the other hand, allow lower voltages to be applied to the source regions. Therefore, the junction depth at the source region can be made shallower than cells utilizing grounded-gated erase schemes, resulting in shorter channel lengths and smaller memory arrays. A typical non-volatile floating gate transistor 200 for use with the negative-gate erase scheme is shown in FIG. 2. Transistor 200 has a channel 205 extending between n+ source region 210 and n+drain region 215 formed in a p− substrate 220. N+source region 210 is formed in a deep n− source junction 225 so that transistor 200 has an asymmetric source/drain. A floating gate 230 is insulated from the surface of p− substrate 220 by a thin tunneling oxide layer 235. A control gate 240 is insulated from floating gate 230 by an oxide-nitride-oxide (ONO) insulating layer 245. Word-line, bit-line, and source-line voltages are applied to control gate 240, n+ drain region 215, and n+ source region 210, respectively, for the various program, verify, erase, and read operations.

A negative-gate erase scheme can be implemented with memory 100 of FIG. 1 utilizing transistor 200, according to one embodiment of the invention. Word-line decoder and driver B 190 couples to corresponding word-lines WL1 to WLM and applies either a negative erase voltage, Verase, (e.g., −8 to −10 volts) to selected word-lines or a ground potential to unselected word-lines. Selected word-lines are ones that contain memory cells selected for erasing. Whether a driver is on depends on whether the selected cell on the corresponding word-line is to be erased. A memory cell is selected to be erased only if the cell has been programmed and needs to be erased. For example, when binary data is being programmed and erased, a programmed memory cell has a high threshold voltage (i.e., above supply voltage Vcc) corresponding to a stored "1", and an erased memory cell has a low threshold voltage (i.e., below supply voltage Vcc) corresponding to a stored "0". Thus, in this case, only memory cells with stored "1"s that are to be erased to store "0"s are selected for the erasing operation. Table 1 below lists the possible situations when a memory cell is to be erased or not and the voltage applied to the word-line containing the memory cell, according to one embodiment. As shown in Table 1, only cells whose currently stored data is "1" and whose new data to be stored is "0" will require erasing.

TABLE 1

| Currently stored data | New data to be stored | erase cell? | voltage on word-line |
|---|---|---|---|
| 0 | 0 | no | 0 volt |
| 0 | 1 | no | 0 volt |
| 1 | 0 | yes | −8 to −10 volts |
| 1 | 1 | no | 0 volt |

Word-line decoder and driver B 190 compares the currently stored data transferred from program and read circuits 150 with the new data to be stored from serial input Din for the M memory cells in a selected sector and applies the appropriate voltage depending on the comparison, according to Table 1. In this embodiment, word-line decoder and driver B 190 is active during erase operations, while word-line decoder and driver A 120 is active during program, read, and verify operations.

In other embodiments, word-line decoder and driver A 120 is active during read and verify operations, while word-line decoder and driver B 190 is active during both program and erase operations. When one decoder and driver is active, the other one is inactive. FIG. 3 is a circuit diagram of one implementation of word-line decoder and driver B 190, which in addition to selective erasing, also allows memory cells to be selectively programmed. Word-line driver B 190 includes M tri-state drivers 300-1 to 300-M, with the output of each of the M tri-state drivers coupled to a corresponding word-line WL1 to WLM in array 110. When the input to a tri-state driver is low, that driver is off and the corresponding word-line is grounded. When the input to a tri-state driver is high, that driver is on and applies an appropriate. program voltage (Vpp) or erase voltage (Verase) to the corresponding word-line.

Each tri-state driver 300-1 to 300-M has its input coupled to one of M NOR gates 310. Each NOR gate 310 has a first input terminal coupled to receive the complement of the data value currently stored in the selected memory cell and a second input terminal coupled to receive the data value ("0" corresponding to an erased state or "1" corresponding to a programmed state) to be stored in the selected memory cell. A first set of M registers 320 can be used to store the current data value in each of the corresponding M memory cells in a selected sector or bit-line. Each of the first set of M registers 320 is coupled between program and read circuits 150, which supply the registers with the current data values of the memory cells, and the first input terminal of each NOR gate 310. A second set of M registers 330 can be used to hold the data value to be stored in each of the corresponding M memory cells, e.g., either a "0" or a "1". Data is stored sequentially in the first and second set of registers via a first and second shift register, respectively. First and second shift registers are well-known and can be formed from a serial chain of M flip-flops 340 and 350, respectively. The input of the first one of flip-flops 340 is coupled to an output of program and read circuits 150, and the input of the first one of flip-flops 350 is coupled to signal DIN, which is a serial stream of M data values to be stored in the M memory cells of a sector. The output of each of the flip-flops 340 and 350 is connected to the input of a succeeding flip-flop, with each of flip-flops 340 and 350 clocked with an input clock (not shown) to form the first and second shift registers. At the output of the last of the M flip-flops 340 and 350, the data stored in the first and second shift registers can be read out serially, e.g., for verifying the data or other functions.

Prior to an erase operation, word-line decoder and driver A 120 is active and initiates a read operation, such as those described in the above-referenced patents and applications, on a particular sector, as selected by column decoder 130. Word-line driver A 120 sequentially applies read voltages to the word-lines, while program and read circuits 150 detect current in the selected sector. In this manner, as is well-known, the data values in the memory cells of the selected sector are serially read out. Typically, the time required to read out the data is smaller than the time required to erase the memory cells. The serial data is then transferred to the first set of flip-flops 340 and loaded into the first set of registers 320. For example, if the second sector (corresponding to bit-line BL2) is selected, the data values of the memory cells can be read out with the data in memory cell CM2 read out first and the data in memory cell C12 read out last. This data is then transferred serially, such that the data in memory cell CM2 is first transferred to the first flip-flop 340 of the first shift register. The data in memory cell C(M-1)2 is then transferred to the first flip-flop and the data in memory cell CM2 is transferred to the second flip-flop. Data propagates through the flip-flops 340 of the first shift register until the data in memory cell C12 is transferred to the first flip-flop and the data in memory cell CM2 is transferred to the last flip-flop. The data in the first set of M flip-flops 340, representing the data currently stored in the M memory cells of the selected sector, can then be loaded into the first set of M registers 320.

The data values which are to be written into the memory cells in the selected sector are loaded similarly into the second set of M registers 330. Serial input DIN, representing a stream of M data values, is sequentially transferred along the second set of M flip-flops 350. Using the above example, the data value which is to stored in the last memory cell CM2 of the selected sector is transferred to the first flip-flop of the second shift register. This value propagates through the second shift register until all M data values of DIN have been transferred into the M flip-flops 350. The data value in each flip-flop 350 is loaded into a corresponding one of registers 330. The transfer and loading of to-be-stored data into respective flip-flops 350 and registers 330 can occur before, after, or during the transfer and loading of currently-stored data into respective flip-flops 340 and registers 320.

Once both sets of data are loaded into registers 320 and 330, tri-state drivers 300-1 to 300-M are activated to apply the appropriate program or erase voltages to the corresponding word-lines. FIG. 4 is a circuit diagram of registers 320 and 330. Once the data has been transferred to the first and second shift registers, a signal LOAD is clocked high (with complementary signal $\overline{\text{LOAD}}$ low) to load the data into registers 320 and 330. A p-channel transistor 401 and an n-channel transistor 402 form a transmission gate (referred to herein as a load transmission gate) to allow data to be input to registers 320 and 330 when signal LOAD is high (by turning on n-channel transistor 402 and p-channel transistor 401).

For an erase operation, signal Erase is set high (signal $\overline{\text{Erase}}$ low) and signal PGM is set low (signal $\overline{\text{PGM}}$ high), which turns on the transmission gate formed from p-channel transistor 403 and n-channel transistor 404 (referred to herein as an erase transmission gate) and turns off the transmission gate formed from p-channel transistor 409 and n-channel transistor 410 (referred to herein as a program transmission gate). As a result, the data transferred to NOR gate 310 corresponds to the same state as the data loaded into registers 320 and 330 from flip-flops 340 and 350, respectively. Thus, if the data currently stored in a memory cell in the selected sector is a "1", corresponding to a programmed state, and a "0" is to be stored in the same memory cell, corresponding to erasing the memory cell, then the output of the associated NOR gate 310 will be "1" or a high signal. As a result, the attached tri-state driver 300 will be activated and apply the power supply voltage to the corresponding word-line. In the other three situations listed in Table 1 above, the output of the NOR gate 310 will be "0" or a low signal, which leaves the attached tri-state driver 300 de-activated and the corresponding word-line grounded.

Also, for an erase operation, the power supply to tri-state drivers 300-1 to 300-M is switched to erase voltage Verase (e.g., −8 to −10 volts). Thus, tri-state drivers 300-1 to 300-M apply erase voltage Verase only to those word-lines containing memory cells selected for erasing. With column decoder 130 (FIG. 1) applying a positive voltage (e.g., 5 to 7 volts) to the source-line of the sector selected for erasing and grounding the source-lines of the unselected sectors, only memory cell(s) in the selected sector and word-line(s) are erased. Consequently, during an erase operation for each sector, only those memory cells in the sector selected for erasing will have the negative erase voltage applied to the control gates, resulting in only those selected cells being erased. By only erasing memory cells that require erasing, the endurance and useful lifetime of the memory cells can be extended.

After the selected memory cells have been properly erased, memory cells in a sector can be selectively programmed to further improve the cell's endurance and useful lifetime. Programming raises the threshold voltage of a memory cell to a value corresponding to a stored "1". Because programmed cells (stored "1") are only erased when required (i.e., only when cells stored with a "1" are to be stored with a "0"), programmed cells that are to remain programmed retain their programmed state (stored "1"). Thus, the only memory cells requiring programming are those that have been erased (stored "0") and are to be stored with a "1", which reduces the total number of programming operations. Table 2 below lists the possible situations when a memory cell is to be programmed or not and the voltage applied to the word-line containing the memory cell, according to one embodiment. As shown in Table 2, only cells whose currently stored data is "0" and whose new data to be stored is "1" will require programming, with application of programming voltage Vpp (e.g., 8 to 10 volts). Word-lines containing memory cells not selected for programming remain at ground.

TABLE 2

| Currently stored data | New data to be stored | program cell? | voltage on word-line |
|---|---|---|---|
| 0 | 0 | no | 0 volt |
| 0 | 1 | yes | 8 to 10 volts |
| 1 | 0 | no | 0 volt |
| 1 | 1 | no | 0 volt |

Referring to FIG. 4, after the erasing operation is completed, signal Erase is set low (signal $\overline{\text{Erase}}$ high) to turn off the erase transmission gate and prevent currently-stored data and to-be-stored data from being transferred to NOR gates 310. For a programming operation, signal PGM is set high (signal $\overline{\text{PGM}}$ low), which turns on the program transmission gate. Located between the program transmission gate and load transmission gate is a standard SRAM cell formed from a p-channel transistor 405 and an n-channel transistor 406 connected in series between ground and a supply voltage Vcc and from a p-channel transistor 407 and an n-channel transistor 408 similarly connected in series between ground and voltage Vcc. The gates of transistors 405 and 406 are connected to a node A between transistors 407 and 408, and the gates of transistors 407 and 408 are connected to a node B between transistors 405 and 406. In the manner of a standard SRAM cell, the voltages at nodes A and B are complementary and thus, node A provides, as an input to the program transmission gate, a signal complementary to the one from the load transmission gate. Thus, with the program transmission gate on, currently-stored and to-be-stored data are complemented before being input to the NOR gates 310. Table 3 below summarizes when tri-state drivers 300 are activated to apply an appropriate programming voltage (e.g., 8 to 10 volts) and when they are de-activated to apply ground to corresponding word-lines.

TABLE 3

| Currently stored data | New data to be stored | output of NOR gate | driver activated? |
|---|---|---|---|
| 0 | 0 | 0 | no |
| 0 | 1 | 1 | yes |
| 1 | 0 | 0 | no |
| 1 | 1 | 0 | no |

FIG. 5 shows the various possible states (programmed or erased) of a memory cell to illustrate the endurance improvement according to the present invention. Assume, initially, that a memory cell is in the erased state. The next state of the memory cell can be still an erased state or changed to a programmed state, neither of which requires erasing prior to entering that state. If the memory cell is in the erased state, as before, the memory cell can remain in an erased state or change to a programmed state. However, if the memory state is in the programmed state, the memory cell can remain in the programmed state or change to an erased state, which requires an erase operation. With conventional erase methods that erase the entire sector, all memory cells in the same sector are erased regardless of whether the cell's current state or subsequent desired state. However, with the present invention, only the memory cell that is changing from a current programmed state to an erased state is erased, as shown by shaded states 500, 501, and 502.

Thus, erasing is performed only when a memory cell is in one of four possible state transitions (only from programmed to erased) instead of erasing when the memory cell is in any of the four possible state transitions. Accordingly, assuming equal probability of the four cases, endurance is improved by four times over conventional sector erasing. Even in a worst case scenario, when the memory cell is changing from a programmed state to an erased state to a programmed state, endurance is doubled because an erase operation is only performed when the cell changes from a programmed state to an erased state, but not when the cell changes from an erased state to a programmed state.

With programming operations, only memory cells in an erased state that are to be changed to a programmed state are programmed, as shown by programmed states 520, 521, 522, and 523. When applied in conjunction with the selective erasing of the present invention, programming operations can be reduced by approximately 50 percent. As seen from FIG. 5, the programmed state 540 does not require programming because the previously programmed state 520 of the cell was not erased to an erased state. Similarly, in the next stage, only memory cells in programmed states 522 and 523 are programmed, while memory cells in programmed states 541 and 542 are not programmed. Thus the frequency of programming is reduced, which again improves the endurance and expected useful lifetime of the memory cell.

Endurance can be further improved by slowly ramping the control gate (or word-line) voltage from 0 volt down to the negative erase voltage of, e.g., −8 to −10 volts, and/or ramping the source (or source-line) voltage from 0 volt up to the positive source voltage of, e.g., 5 to 7 volts during an erase operation. By starting at 0 volt at the start of an erase period, instead of applying the full voltage(s), the memory cell is subjected to less stress during erasing, thereby lengthening the life of the cell. Endurance can also be improved by programming the memory cells with slow or soft programming using small pulses and slow ramping gate and/or drain voltages.

In addition to improving endurance and extending the lifetime of the memory cell, selective erasing and programming according to the present invention also provides other advantages, such as, but not limited to, application with content addressable memories (CAMs) comprising of an array of CAM cells, where each CAM cell is formed from two non-volatile floating gate transistors or any other suitable memory device, such as described in commonly-owned U.S. patent application Ser. No. 09/263,134, entitled "Flash Content Addressable Memory", filed concurrently, which is incorporated by reference herein in its entirety. In a CAM array, a plurality of CAM cells forming a word, i.e., sharing the same word-line and source-line, are programmed and erased at the same time, so that the CAM array has to be designed with devices capable of handling large current requirements. By having the ability to only program and erase selected memory cells, the large current requirements are relaxed, thereby reducing power consumption and costs of the array.

Note that the memory cells of memory array 110 in FIG. 1 are configured as sectors having one bit-line and source-line per sector and each memory cell in the sector having the control gate coupled to an individual word-line. However, other configurations are also suitable for this invention, where the memory cells are configured so that two voltages applied via two separate lines coupling the memory cells uniquely erase a selected cell while leaving unselected cells in their original state. One such memory array is a CAM array, such as described in the above-referenced U.S. patent application entitled "Flash Content Addressable Memory".

Memory 100 of FIG. 1, described above, is one embodiment for using the negative-gate erase scheme to erase non-volatile memory cells. However, as noted earlier, other erase schemes are also suitable that apply two non-zero voltages to two terminals of the memory cell, and which in combination, are sufficient to erase a selected memory cell in a sector. One type of suitable erase scheme (herein referred to as a channel-erase scheme) applies a negative erase voltage (e.g., −8 to −10 volts) to the control gate of the selected cell, as before, while applying a positive voltage (e.g., 5 to 7 volts) to a shallow p-well of the selected cell. The source and drain of the selected are left floating during a channel-erase operation.

Such a memory cell structure is shown FIG. 6. Similar to transistor 200 of FIG. 2, non-volatile floating gate transistor 600 has a channel 605 extending between n+ source region 610 and n+ drain region 615 formed in a p− substrate 620. However, unlike transistor 200, n+ source region 610 and n+ drain region 615 are formed in a shallow p− well 623, which is formed in a deep n− well 627 in p− substrate 620. Without an additional deep source junction, transistor 600 has a symmetric source/drain and is capable of shorter channel lengths, thereby allowing smaller memories. A floating gate 630 is insulated from the surface of p− well 623 by a thin tunneling oxide layer 635. A control gate 640 is insulated from floating gate 630 by a gate oxide or insulating layer 645. Word-line, bit-line, and source-line voltages are applied to control gate 640, n+ drain region 615, and n+ source region 610, respectively, for the various program, verify, erase, and read operations. For the channel-erase scheme, one combination of voltages to erase a selected cell are −8 to −10 volts applied to control gate 640, a floating potential applied to n+ source region 610 and n+ drain region 615, 5 to 7 volts applied to shallow p− well 623, at least 5 to 7 volts applied to deep n− well 627, and ground applied to p− substrate 620.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A method for erasing a selected memory cell in a selected sector of a memory array, comprising:

applying a first voltage to a first word-line coupled to a control gate of the selected memory cell;

applying a second voltage to a voltage line coupled to a terminal of the selected memory cell;

applying a third voltage to a bit-line coupled to the drain of the selected memory cell, wherein the combination of the first, second, and third voltages changes the threshold of the selected memory cell corresponding to an erased state; and applying a fourth voltage that differs from the first voltage to a second word-line, wherein the second word-line is coupled to a control gate of an unselected memory cell that has a terminal coupled to the voltage line, wherein the terminal is a shallow p-well of the selected and unselected memory cell.

2. The method of claim 1, further comprising applying a fifth voltage to a source-line coupled to a source of the selected memory cell.

3. The method of claim 2, wherein the first voltage is approximately −8 to −10 volts and the second voltage is approximately 5 to 7 volts.

4. The method of claim 3, wherein the third and fifth voltages are floating potentials.

5. The method of claim 1, wherein memory cells coupled to the bit-line and the voltage line form a sector.

6. The method of claim 1, wherein the selected memory cell is only a memory cell currently in a programmed state and selected to be in an erased state.

7. A method of erasing memory cells in a sector of a memory array, comprising:

determining whether a selected cell in the sector requires erasing, wherein the first combination of voltages comprises a negative control gate voltage and a positive shallow p-well voltage; and applying a second combination of voltages to the memory cell if the memory cell does not require erasing.

8. The method of claim 7, wherein the second combination of voltages comprises an approximately 0 volt control gate voltage and the positive shallow p- well voltage.

9. The method of claim 7, wherein the determining comprises comparing the current threshold voltage with the desired threshold voltage of the selected memory cell.

10. The method of claim 9, wherein the determining further comprises choosing the selected memory cell to be erased only if the current threshold voltage corresponds to a logic "1" and the desired threshold voltage corresponds to a logic "0".

* * * * *